United States Patent
Sutter et al.

(10) Patent No.: US 9,331,451 B2
(45) Date of Patent: May 3, 2016

(54) PUMP RADIATION ARRANGEMENT AND METHOD FOR PUMPING A LASER-ACTIVE MEDIUM

(71) Applicant: TRUMPF LASER GMBH, Schramberg (DE)

(72) Inventors: Dirk Sutter, Rottweil (DE); Alexander Killi, Trossingen (DE); Jochen Kleinbauer, Deisslingen (DE); Yufeng Li, Plainsboro, NJ (US)

(73) Assignee: TRUMPF LASER GMBH, Schramberg (DE)

( * ) Notice: Subject to any disclaimer, the term of this patent is extended or adjusted under 35 U.S.C. 154(b) by 0 days.

(21) Appl. No.: 14/501,401

(22) Filed: Sep. 30, 2014

(65) Prior Publication Data

US 2015/0139263 A1 May 21, 2015

Related U.S. Application Data

(63) Continuation of application No. PCT/EP2013/055217, filed on Mar. 14, 2013.

(60) Provisional application No. 61/617,931, filed on Mar. 30, 2012.

(30) Foreign Application Priority Data

May 3, 2012 (DE) .................... 10 2012 207 339

(51) Int. Cl.
*H01S 3/091* (2006.01)
*H01S 3/0941* (2006.01)
(Continued)

(52) U.S. Cl.
CPC ............. *H01S 3/091* (2013.01); *H01S 3/09415* (2013.01); *H01S 3/094084* (2013.01);
(Continued)

(58) Field of Classification Search
CPC ... H01S 3/067; H01S 3/09415; H01S 3/0675; H01S 3/005; H01S 3/06758; H01S 3/094042; H01S 3/0057; H01S 3/06712; H01S 3/091; H01S 3/094084; H01S 5/0654; H01S 5/142; H01S 3/0604; H01S 3/094015; H01S 3/1055; H01S 3/1062; H01S 3/1618; H01S 3/1643; H01S 5/0656; H01S 5/146

USPC .......................................................... 372/70
See application file for complete search history.

(56) References Cited

U.S. PATENT DOCUMENTS 5,272,708 A * 12/1993 Esterowitz et al. ............. 372/20
5,513,196 A * 4/1996 Bischel et al. .................. 372/22
(Continued)

FOREIGN PATENT DOCUMENTS

DE   102004011456 A1   8/2005
DE   102009019996 B4   9/2011
(Continued)

OTHER PUBLICATIONS

Notification of Transmittal of International Preliminary Report on Patentability and the Written Opinion of the International Search Authority for corresponding PCT Application No. PCT/EP2013/055217, mailed Oct. 9, 2014, 11 pages.
(Continued)

*Primary Examiner* — Tod T Van Roy
*Assistant Examiner* — Vu A Vu
(74) *Attorney, Agent, or Firm* — Fish & Richardson P.C.

(57) ABSTRACT

The disclosure relates to a pump radiation arrangement comprising: a pump radiation source for producing pump radiation, a means for stabilizing the wavelength of the pump radiation source and a laser-active medium through which the pump radiation passes in a bidirectional manner. The pump radiation arrangement also has a retro-reflector for reflecting pump radiation which is not absorbed by the laser-active medium back to the pump radiation source and a wavelength-selective element for preventing a wavelength destabilization of the pump radiation source by filtering out undesirable spectral portions of pump radiation which is not absorbed by the laser-active medium. The invention also relates to an associated method for pumping a laser-active medium.

16 Claims, 4 Drawing Sheets

(51) Int. Cl.
*H01S 5/065* (2006.01)
*H01S 5/14* (2006.01)
*H01S 3/094* (2006.01)
*H01S 3/1055* (2006.01)
*H01S 3/106* (2006.01)
*H01S 3/16* (2006.01)
*H01S 3/06* (2006.01)

(52) U.S. Cl.
CPC ............. *H01S 5/0654* (2013.01); *H01S 5/142* (2013.01); *H01S 3/0604* (2013.01); *H01S 3/094015* (2013.01); *H01S 3/1055* (2013.01); *H01S 3/1062* (2013.01); *H01S 3/1618* (2013.01); *H01S 3/1643* (2013.01); *H01S 5/0656* (2013.01); *H01S 5/146* (2013.01)

(56) References Cited

U.S. PATENT DOCUMENTS

| | | | | |
|---|---|---|---|---|
| 6,462,306 | B1* | 10/2002 | Kitai et al. | 219/121.77 |
| 7,567,608 | B2* | 7/2009 | Chung | 372/102 |
| 7,636,376 | B2* | 12/2009 | Moser | H01S 5/141 372/101 |
| 2002/0071457 | A1 | 6/2002 | Hogan | |
| 2003/0012250 | A1* | 1/2003 | Shirasaki | 372/98 |
| 2003/0025987 | A1 | 2/2003 | Erhard et al. | |
| 2003/0138000 | A1* | 7/2003 | Bayart | H01S 3/0675 372/6 |
| 2005/0105084 | A1 | 5/2005 | Wang et al. | |
| 2005/0226304 | A1 | 10/2005 | Schwarz et al. | |
| 2008/0013574 | A1* | 1/2008 | Furuya | H01S 3/0675 372/6 |
| 2009/0225793 | A1* | 9/2009 | Marciante | H01S 3/302 372/6 |
| 2010/0135350 | A1 | 6/2010 | Ovtchinnikov et al. | |
| 2010/0272135 | A1* | 10/2010 | Kuksenkov et al. | 372/22 |
| 2010/0290105 | A1 | 11/2010 | Furuya et al. | |
| 2011/0150013 | A1 | 6/2011 | Spinelli et al. | |
| 2011/0249698 | A1 | 10/2011 | Hertwig et al. | |
| 2011/0268140 | A1* | 11/2011 | Keaton | H01S 3/0675 372/3 |
| 2012/0093187 | A1 | 4/2012 | Koeth et al. | |

FOREIGN PATENT DOCUMENTS

| | | |
|---|---|---|
| WO | WO0157970 A1 | 8/2001 |
| WO | WO02071119 A1 | 9/2002 |
| WO | WO2006025849 A2 | 3/2006 |
| WO | WO2011101614 A1 | 8/2011 |

OTHER PUBLICATIONS

Bunkowsi et al., "High reflectivity grating waveguide coatings for 1064 nm", Classical and Quantum Gravity, 23, 8 pages, Nov. 3, 2006.

* cited by examiner

PUMP RADIATION ARRANGEMENT AND METHOD FOR PUMPING A LASER-ACTIVE MEDIUM

CROSS REFERENCE TO RELATED APPLICATIONS

This application is a continuation of and claims priority under 35 U.S.C. §120 to PCT Application No. PCT/EP2013/055217 filed on Mar. 14, 2013, which claimed priority to German Application No. 10 2012 207 339.6, filed on May 3, 2012, which claimed priority to U.S. Ser. No. 61/617,931 filed on Mar. 30, 2012. The contents of both of these priority applications are hereby incorporated by reference in their entirety.

TECHNICAL FIELD

The present disclosure relates to a pump radiation arrangement and method for pumping a laser-active medium.

BACKGROUND

WO 2006/025849 A2 discloses a radiation source for high radiation power levels which includes a semiconductor diode laser as a pump radiation source and a reflector which has a grating structure. The reflector is optically connected to the semiconductor diode laser and is orientated with respect to an output beam of the diode laser in such a manner that a portion of the radiation in the output beam is reflected back into the diode laser by the reflector.

The laser radiation (transmitted by the reflector) which is produced by means of the radiation source described in WO 2006/025849 A2 may be used as pump radiation for pumping a laser-active medium. Such a laser-active medium typically has a very narrow absorption line, that is to say, a very narrow wavelength range, in which the pump radiation is absorbed. For pumping a laser-active medium, the wavelength-dependent feedback of a portion of the pump radiation to the pump radiation source is advantageous because, in this instance, stabilization of the emitted wavelength is carried out so that the portion of the pump radiation transmitted by the reflector has a spectrum having a substantially narrower band than would be the case without such stabilization. Consequently, the pump efficiency can be increased by the reflector because the portion of the pump radiation received by the laser-active medium increases.

For efficient pumping, the path of the pump radiation through the laser-active medium should also be as long as possible in order to increase the absorption. However, long beam paths can cause, in the laser-active medium, thermal effects that result in a worsening of the beam quality of the laser radiation that is produced or intensified by the active medium. Furthermore, the beam quality of the laser radiation that is produced or intensified should generally be substantially greater than that of the pump radiation so that, with similar beam waists, the pump radiation diverges to a substantially greater extent so that a good spatial overlap of the pump radiation and laser radiation as well as an efficient energy transfer from the pump radiation to the laser radiation can be ensured only over a short distance. Furthermore, for many lasers or amplifiers long path lengths within the active medium are unfavorable for other reasons. For instance, the linear dispersion is usually disruptive for ultra-short pulsed lasers and/or the non-linearity of the medium (e.g., self-phase modulation, four-wave mixing, Raman or Brillouin scattering) is disruptive at high peak power levels. Therefore, the travel path in the laser medium is selected to be as short as possible in the case of laser crystals but also in laser glasses such as, for example, amplification fibers as a laser-active medium in fiber lasers, and the pump radiation is caused to pass through several times or pumping is carried out from several sides. The pump radiation can preferably be reflected back into itself at an end mirror, whereby a portion of the pump radiation not absorbed by the laser-active medium is reflected back to the pump radiation source so that the propagation path through the laser medium is doubled and the absorption efficiency is maximized.

However, the wavelength-stabilized pump radiation which is transmitted by the reflector also generally has, in spite of the reflector which reflects the wavelength in a narrow band, a spectral portion in a wavelength range which is not absorbed or which is absorbed only weakly by the laser-active medium. That undesirable spectral portion is reflected back by the end mirror to the pump radiation source. In particular, if the pump radiation arrangement is operated at high radiation power levels, for example, in the case of three-level or quasi-three-level laser media, the absorption attenuates as a result of the increasing inversion of the laser medium, which occurs particularly in the so-called zero phonon absorption line (for example, 969 nm in Yb:YAG or 976 nm in Yb:Lu2O3). However, the undesirable spectral portion reflected back results in a destabilization of the pump radiation source so that the spectrum of the pump radiation which is transmitted by the reflector is expanded in an undesirable manner. Such an expansion of the pump radiation spectrum relative to the absorption spectrum of the laser-active medium reduces the efficiency of the pump radiation arrangement in spite of the reflector so that the output power of the laser or amplifier cannot be increased as desired.

SUMMARY

An object of the present disclosure is a pump radiation arrangement and a method for pumping a laser-active medium so that a high level of efficiency is ensured at high pump power levels.

The pump radiation arrangement may include a pump radiation source for producing pump radiation and a device for stabilizing the wavelength of the pump radiation source such as, for example, a grating. The pump radiation arrangement may further include: a laser-active medium through which the pump radiation passes in a bidirectional manner; a retro-reflector for reflecting pump radiation that is not absorbed by the laser-active medium along substantially the same beam path or beam travel back to the pump radiation source; and a wavelength-selective element for preventing a wavelength destabilization of the pump radiation source by filtering out undesirable spectral portions of pump radiation that are not absorbed by the laser-active medium. For example, it is possible to use one laser diode or multiple laser diodes which is/are wavelength-stabilized using a medium, e.g., a grating structure, as the pump radiation source. Depending on the configuration, the wavelength-selective element can transmit or reflect the desired spectral portions of the pump radiation.

Undesirable spectral portions, i.e., spectral portions that are at the edge of or outside the absorption line of the laser-active medium and that are therefore absorbed to a lesser extent or not at all, and which may have a disadvantageous effect on the efficiency of the pump radiation arrangement, are filtered out using at least one wavelength-selective element. The use of a wavelength-selective element in the beam path of the pump radiation prevents the disadvantages which exist in other possibilities for preventing the introduction of the undesirable radiation portions into the pump radiation source. Thus, for example, the introduction of an optical isolator (for example, a Faraday isolator) between the pump radiation source and the laser-active medium cannot be used advantageously at high laser powers owing to the residual absorption.

The device used for the wavelength-stabilization of the pump radiation source, more specifically the laser-active medium provided therein, may be a grating structure which is inscribed to the laser-active medium, as is the case, for example, in laser sources of the "distributed feedback laser" (DFB) type, as described, for example, in DE 102009019996 B4. The grating structure may also be arranged outside the laser-active zone but in a waveguide which is integrated in the same chip, as is the case, for example, in the "distributed bragg reflector laser" (DBR laser).

The pump radiation arrangement has a retro-reflector for reflecting pump radiation that is not absorbed by the laser-active medium, typically along substantially the same beam path back to the pump radiation source. The retro-reflector allows the pump radiation to pass through the laser-active medium at least one more time, whereby the efficiency of the pump radiation arrangement is increased. Although the number of pump light passes can also be increased without a retro-reflector using multiple redirections, such as multi-pass pump radiation arrangements for disc lasers using a large solid angle (see, for example, WO2001/057970A1), a doubling of the pump light passes cannot be achieved or can be achieved therein only at disproportionate costs without the use of a retro-reflector.

Although it would also be possible, instead of using a wavelength-selective element, to attempt to change the beam path of the pump radiation so that the portion of the pump radiation reflected back by the retro-reflector passes through the laser-active medium at a different angle so that the pump radiation reflected back thereon is no longer introduced into the pump radiation source, the overlap region in the laser-active medium would be reduced with this method. And the beam quality of the laser radiation produced in the laser-active medium would decrease if the beam quality of the pump radiation cannot be readily increased. Accordingly, a wavelength-selective element is also particularly advantageous for stabilizing the pump radiation source when a retro-reflector is used.

In some implementations, the device or the grating structure for wavelength stabilization forms a wavelength-dependent reflector in order to reflect back a portion of the pump radiation produced to the pump radiation source and to supply a transmitted portion of the pump radiation to the laser-active medium. The reflector may be, for example, a volume bragg grating which can be arranged with spacing from the pump radiation source or a pump diode which is provided therein. If a wavelength-stabilized fiber laser is used as the pump radiation source, the wavelength-stabilized pump radiation of such a pump fiber laser may be produced, for example, by a reflector which is constructed as a fiber bragg grating. In general, the reflector that stabilizes the pump radiation in terms of wavelength may form an output coupling mirror of the pump radiation source.

The retro-reflector for feeding back the pump radiation to the pump radiation source may optionally be identical to the wavelength-stabilizing reflector. In this case, the pumped laser-active medium is potentially inside the resonator of the pump radiation source. The losses that occur due to the absorption of the pump radiation within that resonator (which may be an external, coupled resonator) may not be so powerful that the pump radiation source no longer emits narrow-band laser radiation. Therefore, the retro-reflector should be configured to have a narrower band (i.e., should reflect a smaller wavelength range) than the absorption line of the pumped laser-active medium.

Although an increase of the desired spectral portion of the pump radiation reflected back by the reflector would also result in an improvement of the wavelength stabilization, at the same time it increases the optical load of the pump radiation source or optical elements that are used to form beams so that the pump radiation source or the beam-forming element age quicker or are destroyed. The efficiency of the pump radiation source may also decrease as a result of the increased feedback of the reflector so that the use of a wavelength-selective element for wavelength stabilization is also advantageous when a reflector is used.

In some implementations, the wavelength-selective element is an interference filter. The effect of an interference filter is based on the interference between direct and repeatedly reflected radiation on thin layers.

In some implementations, the wavelength-selective element is in the form of a cutoff filter or a combination of cutoff filters, of which one or more transmit(s) only radiation at the desired wavelength and longer-wave radiation. One or more other filter(s) also may transmit(s) shorter-wave radiation in addition to radiation at the desired wavelength. In many cases, it may be sufficient to carry out spectral filtering only at one side of the absorption line of the laser-active medium in order to stabilize the pump light source.

Filters that have a wavelength-selective effect due to the absorption of pump radiation may optionally also be used as wavelength-selective elements. The filters may be in the form of band pass filters, high-pass filters or low-pass filters.

In some implementations, the interference filter is an etalon that is orientated at an angle relative to the beam direction of the pump radiation. The effect of an etalon is based on the basic principle of the Fabry/Perot interferometer, in which typically two planar mirror faces which are orientated parallel with each other and which are arranged with small spacing (for example, approximately 40 micrometers) are used in order to form a resonator (cavity). Such an etalon transmits only radiation at a wavelength which complies with the resonance condition. As a result of the arrangement of such an etalon whose surface normal is inclined at a (typically small) angle relative to the beam direction in order to avoid back-reflections of the undesirable spectral components to the pump radiation source, the undesirable radiation portions can be decoupled in a selective manner because the wavelength at which the transmission of the etalon is at a maximum can be influenced by means of the angle in a targeted manner.

There is preferably used as the etalon a substrate, for example, in the form of a thin plane-parallel plate (as a resonator) which is provided with a (partially) reflecting coating on both lateral faces. In this instance, a coating, for example, in the form of a stack of alternating highly and weakly refracting quarter-wave layers on the substrate which is non-reflective at the rear side can be applied to a lateral face, the thickness of which substrate corresponds, for example, to a multiple of a half-wave layer. A coating which is fitted to the other lateral face may have another stack of alternating highly and weakly refracting quarter-wave layers. The indications "half-wave" and "quarter-wave" layers relate in this instance to the optical thickness of the layers which corresponds to half or quarter of the central (resonant) wavelength of the etalon. However, it is also optionally possible to use other types of etalon, for example, so-called air-spaced etalons in which two thin planar plates are maintained at a predetermined spacing relative to each other by spacers.

In some implementations, the etalon is in the form of a thin-layer etalon, that is to say, the etalon is produced inside a thin-layer coating. To that end, for example, a suitable alternating stack of highly and weakly refracting quarter-wave layers acting as a partial reflector on a substrate which is non-reflective at the rear side can be followed by a multiple of a half-wave layer and a repeated alternating stack of quarter-wave layers as a second partial reflector, with the number of layers being selected so that the etalon in resonance has a practically 100% transmission. Other suitable layer systems can also be selected in place of quarter-wave layers.

In some implementations, the pump radiation arrangement has a collection element for redirecting and/or absorbing the undesirable spectral portions which are redirected by the wavelength-selective element, in particular an etalon, from the path of the pump radiation. The undesirable spectral portions are reflected by the etalon (or another wavelength-selective element which is arranged in a tilted manner) and coupled out from the beam path of the pump radiation because of the arrangement of the etalon at a tilting angle relative to the beam direction. The collection element can be provided, for example, with a reflective coating in order to redirect the undesirable radiation portions to an absorber. The collection element may itself also be constructed as an absorber which absorbs the power of the undesirable radiation portions, for example, in the manner of a heat sink.

In some implementations, the laser-active medium is a solid-state crystal and the wavelength-selective element, e.g., the interference filter, is arranged in the beam path of the pump radiation between the grating structure and the solid-state crystal or between the solid-state crystal and the retro-reflector. The solid-state medium or solid-state crystal is typically a doped crystal, for example, a Yb:YAG or Yb:sesquioxide crystal (for example, Yb:Lu2O3). The pumped solid-state medium may have a different geometry: for example, it may be a laser disc through which the pump radiation generally passes several times by the pump radiation being reflected back repeatedly to the laser disc using multiple mirrors. Alternatively, it is also possible to use as the laser-active solid-state medium, among other things, a rod-like laser medium (rod laser) or a plate-like medium (so-called slab laser).

In some implementations, the retro-reflector is in the form of a wavelength-selective element. In this manner, it is possible to dispense with an additional, transmissive optical element for wavelength selection in the beam path of the pump radiation. The wavelength-selective element may in this example form a mirror which the pump radiation strikes at a suitably selected angle of incidence which is different from 0° in order to reflect it back to the laser-active medium. For example, the wavelength-selective element may be a blazed grating in a Littrow arrangement. Such a blazed grating reflects radiation only in one specific direction and consequently for a given wavelength only in one specific order of diffraction. In the Littrow arrangement, the angle of incidence corresponds to the angle of reflection (and the so-called blaze angle) so that the pump radiation is reflected back into itself.

In particular, however, the retro-reflector is also an end mirror, which the pump radiation strikes in a substantially perpendicular manner so that the pump radiation is reflected back into itself. A mirror of the pump light arrangement may also optionally be used as a wavelength-selective element, in which the mirror is not used as a retro-reflector or as an end mirror, and may, for this purpose, be provided, for example, with a grating structure and/or be provided with a wavelength-selective coating as an (interference) filter.

In some implementations, the retro-reflector has a grating structure. Both in the retro-reflector and in the reflector of the pump radiation source, a grating structure or a pattern of refraction index variations may be produced in various manners, for example, as described in WO2006/025849 A2, as a holographic grating, as a photonic bandgap crystal, or as an interference filter reflector.

In some implementations, the retro-reflector is in the form of a volume bragg grating. Such a volume bragg grating can be produced, for example, by a photo-thermo-refractive material exposed to a radiation distribution with a periodic pattern, as described in detail in WO2006/025849 A2.

In some implementations, the retro-reflector is in the form of a grating waveguide mirror. Such a mirror has a high level of angular acceptance and a high degree of efficiency so that it may be possible to dispense with fine adjustment. The grating waveguide mirror may be constructed, for example, as described in the article "High Reflectivity Grating Waveguide Coatings for 1064 nm" by A. Bunkowski et al., Classical and Quantum Gravity 23, 7297 ff. In such a mirror, a highly refractive medium which forms the waveguide is applied to a weakly refractive medium (substrate). At the side of the highly refractive medium facing away from the substrate, there is fitted a grating structure which, in conjunction with the total reflection at the boundary face between the two media, results in a constructive interference and consequently the reflection of radiation in the case of a specific wavelength (target wavelength).

In some implementations, the laser-active medium is a laser-active fiber and the pump radiation arrangement includes a pump fiber portion for supplying pump radiation to the laser-active fiber. In this instance, the pump radiation arrangement serves to pump an optical fiber, more specifically a laser-active core (for example, ytterbium or erbium-doped core) of an optical fiber. The pump radiation may be coupled into the pump fiber portion, for example, by a component for wavelength multiplexing (wavelength division multiplexer/WDM) from the pump radiation source. For the optical pumping, the pump radiation is guided along an interaction region parallel with the fiber core or the cladding thereof and couples into the laser-active fiber core or is absorbed thereby. It will be understood that it is also possible to directly pump (at the end side) the laser-active fiber optionally without using pump fiber portions for supplying and optionally leading away pump radiation.

In some implementations, the pump radiation arrangement has another pump fiber portion for supplying pump radiation which is not absorbed by the laser-active fiber to the retro-reflector. The pump fiber portion and the additional pump fiber portion may form in this instance two portions of one and the same pump fiber which extends in a pump fiber portion therebetween parallel with the laser-active fiber (and with little spacing). Alternatively, the pump fiber portions can be spliced at the two ends of the interaction region to the laser-active fiber or the cladding thereof. In any case, the retro-reflector is used to direct the pump radiation back via the additional pump fiber portion to the interaction region so that it is directed back to the pump radiation source via the first pump fiber portion. It is optionally also possible to carry out optical pumping, in which the pump radiation is coupled into the laser-active fiber at the end side and is optionally also coupled out again. This is particularly helpful if pump radiation is intended to be coupled directly into the laser-active core of the fiber with a high pump power density, or if the desired pump power is not available in a fiber-coupled state.

In some implementations, the retro-reflector is in the form of a fiber bragg grating which is formed in the additional pump fiber portion. Such a fiber bragg grating can be inscribed into the region of a free end of the pump fiber portion using a laser pattern generator and acts as a wavelength-selective element.

In some implementations, an objective is arranged between an end side of the second pump fiber portion and the retro-reflector. The objective serves to focus or collimate the pump radiation decoupled from the end of the second pump fiber portion onto the retro-reflector which in this instance is preferably in the form of a volume bragg grating. As a result of such an objective being provided, it is also possible to use a conventional wavelength-selective element, that is to say, an element not inscribed in the fiber core (such as, for example, a volume bragg grating) as a retro-reflector in a fiber laser as a laser-active medium.

In some implementations, the pump radiation arrangement includes at least one additional pump radiation source for supplying additional pump radiation to the laser-active fiber, the additional pump radiation typically having a pump radiation wavelength which is adjacent to the pump radiation of the pump radiation source. In this case, the pump radiation of the pump radiation sources can be coupled into the laser-active fiber in the same or opposing directions via a WDM element or a DWDM element (dense wavelength multiplexing).

The disclosure also relates to a method for pumping a laser-active medium which includes producing pump radiation using, for example, a grating structure, and pumping the laser active medium using the pump radiation.

The method also may include filtering out spectral portions of pump radiation which are not absorbed by the laser-active medium and which are directed back to the pump radiation source by a retro-reflector using a wavelength-selective element in order to prevent wavelength destabilization of the pump radiation source. The wavelength-selective element or the pump radiation arrangement used in carrying out the method can be constructed as described above. The advantages described above in conjunction with the pump radiation arrangement also apply accordingly to the method for pumping the laser-active medium.

In some implementations, the stabilization of the wavelength of the pump radiation is carried out by a wavelength-dependent reflector (typically with a grating structure) which reflects back a portion of the pump radiation to the pump radiation source and supplies a transmitted portion of the pump radiation to the laser-active medium. That is to say, the grating structure acts as a reflector. Such a grating structure can be constructed, for example, in the form of a volume bragg grating or a fiber bragg grating.

Additional advantages will be appreciated from the description and the drawings. The above-mentioned features and those set out below may also be used individually or together in any combination. The embodiments shown and described are not intended to be understood to be a conclusive listing but are instead of exemplary character for describing the invention.

DETAILED DESCRIPTION

Figure 1A:
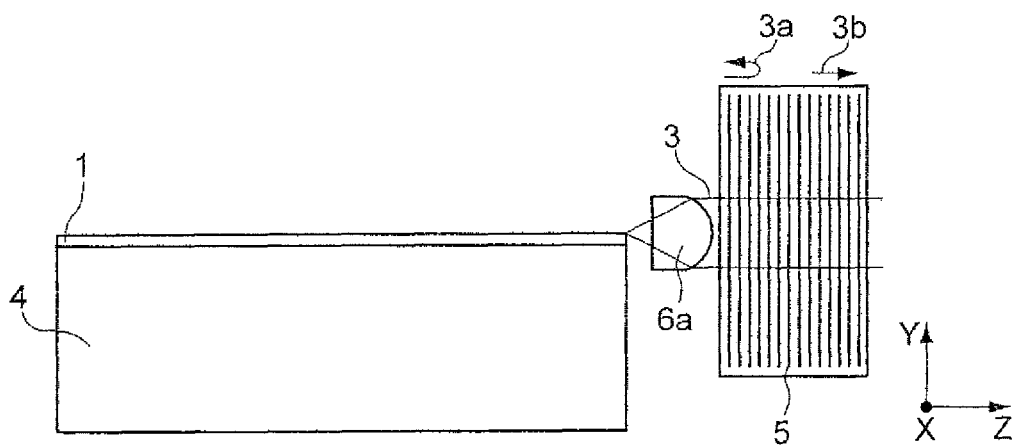
FIGS. 1a and 1b are schematic illustrations of a pump radiation source in the form of a semiconductor laser diode having a reflector in the form of a volume bragg grating.
Figure 1B:
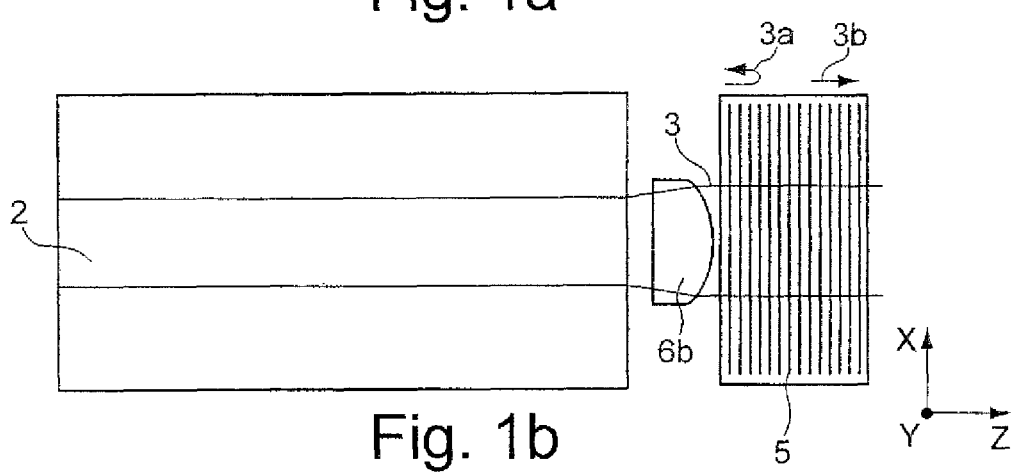

FIGS. 1a, b are a schematic side view and top view of a pump radiation source 1, respectively. The pump radiation source 1 is in the present example a laser diode for producing pump radiation at a target wavelength $\lambda_z$ of, for example, 969 nm for pumping Yb:YAG or, for example, 976 nm for pumping Yb:Lu2O3 as a laser-active medium. The pump radiation source 1 has an active region 2 in which photons or pump radiation 3 are produced if the pump radiation source 1 is supplied with a current density which exceeds the threshold current density. The active region 2 comprises in the present example InGaAs but other semiconductor materials may also be used. The pump radiation source 1 is applied to a heat sink 4 and emits pump radiation 3 which propagates in the Z direction of an XYZ coordinate system.

The pump radiation 3 is discharged from the pump radiation source 1 in a divergent manner, the divergence which the pump radiation 3 has in the Y direction ("fast axis") differing from the divergence of the pump radiation 3 in the X direction ("slow axis"). The pump radiation 3 strikes a reflector in the form of a volume bragg grating 5 which has a grating structure which in the present case is in the form of a line pattern or line grating. The volume bragg grating 5 reflects a portion 3a of the striking pump radiation 3 back to the pump radiation source 1 in order to suppress undesirable modes which are excited in the pump radiation source 1.

The volume bragg grating 5 has comparatively little influence on the divergence of the pump radiation 3 in the Y direction, for which reason a cylindrical lens 6a is arranged between the pump radiation source 1 and the volume bragg grating 5 in order to collimate the pump radiation 3. In a similar manner, another cylindrical lens 6b for collimation may be provided in order to change the divergence of the pump radiation 3 in the X direction. In order to change the divergence in the X direction, a dispersing lens may also be provided in place of the focusing lens 6b in order to suppress undesirable modes in the pump radiation source 1. Similarly, it is also possible to completely dispense with the additional lens 6b in some arrangements. Unlike what is shown in FIGS. 1a, b, a single lens element may also be used in order to adapt the divergence of the pump radiation 3 both in the Y direction and in the Z direction. The volume bragg grating 5 may also optionally be fitted, unlike what is shown in FIGS. 1a, b, directly to the face at which the pump radiation 3 is discharged from the pump radiation source 1.

Figure 2:
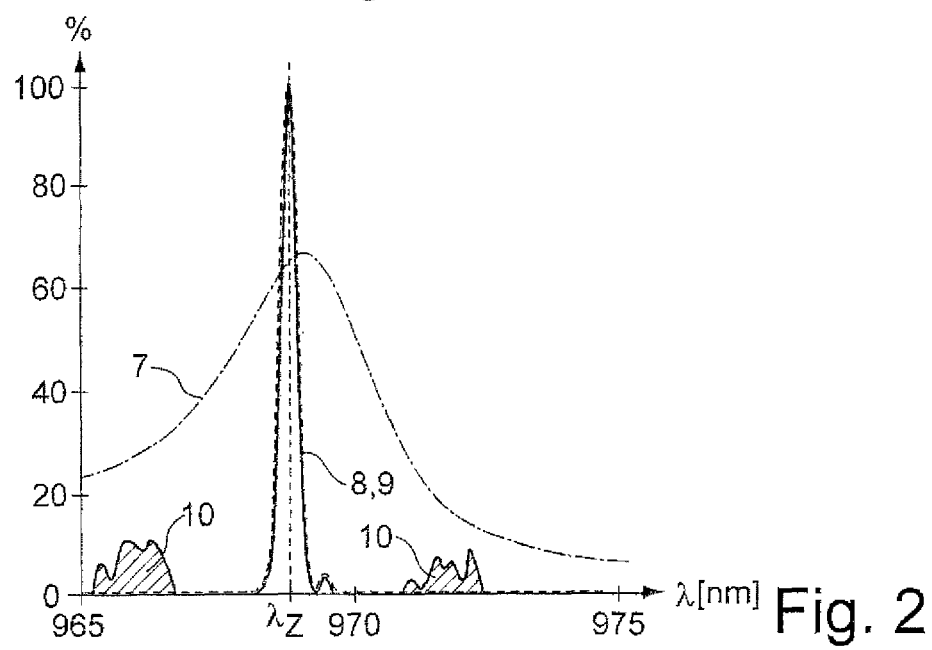
FIG. 2 is a schematic illustration of a spectrum of the pump radiation produced by the pump radiation source in a pump arrangement having a retro-reflector without or with the use of the wavelength-selective element according to the invention.

The effect of the volume bragg grating 5 on the pump radiation 3 that is produced from the pump radiation source 1 can be seen in FIG. 2. FIG. 2 shows the radiation intensity of the pump radiation 3, using the example of a pump arrangement for Yb:YAG as a laser-active medium, as a function of the wavelength $\lambda_z$. The radiation intensity has an intensity distribution which has a maximum at the target wavelength $\lambda_z$ and which has a substantially Gaussian, narrow-band profile 8. Such a narrow intensity profile 8 can be produced if a portion 3a of the pump radiation 3 is reflected back into the pump radiation source 1 or into the active region 2 using the volume bragg grating 5, as set out above.

A narrow-band intensity profile 8 is advantageous because the pump radiation 3 is used to pump a laser-active medium that absorbs radiation efficiently only within a comparatively narrow wavelength range 7. FIG. 2 shows by way of example such a (calculated) absorption spectrum 7 of a laser-active medium in the form of a thin Yb:YAG laser disc in a multi-pass pump radiation arrangement with a retro-reflector, with high inversion. As a result of the limited number of pump radiation passes and because of the attenuation of the absorption during inversion, significantly fewer spectral portions are absorbed at both sides of the absorption line and therefore return to the pump diode.

The amplification spectrum of the pump light source 1 or the diode also supports spontaneous radiation emission outside the narrow-band, emitted spectral range 8 that can become stimulated to form laser radiation in the case of sufficient feedback via the retro-reflector. The spectrum of the pump diode 8 expands, as a result of the limited reflectivity of the volume bragg grating reflector used, at a wavelength of 969 nm to wider, undesirable emission bands 10 at wavelengths of from 965 nm to 966 nm or at wavelengths of from 971 nm to 972 nm. Depending on the position of the amplification spectrum of the diode or depending on the diode temperature and semiconductor composition, either excessively short-wave or excessively long-wave radiation or both excessively short-wave and excessively long-wave radiation can be excited. By a wavelength-selective element (e.g., a filter) being added, those wider emission bands 10 can be suppressed so that there is produced an intensity distribution 9 (illustrated in FIG. 2 with broken lines) that corresponds to the one without the feedback via the retro-reflector. The portion of the pump radiation absorbed by the laser disc thereby increases, and subsequently the efficiency or the output power of the pumped laser-active medium.

Figure 3A:
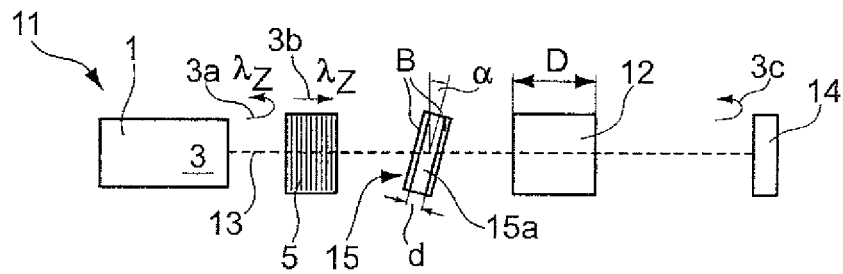
FIGS. 3a and 3b are schematic illustrations of a pump radiation arrangement having an etalon as a wavelength-selective element.
Figure 3B:
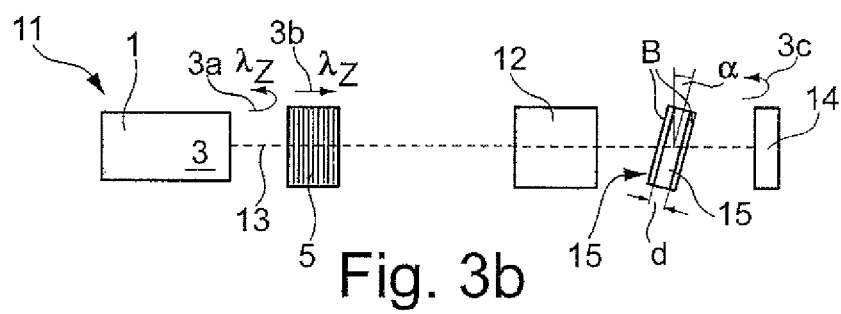

FIGS. 3a, b show such a laser-active medium 12 in the form of a Yb:YAG laser crystal which is arranged in a pump radiation arrangement 11 in the pump beam path 13 of the pump radiation source 1 and which is excited by the pump radiation 3 in order to emit laser radiation (not shown) at an emission wavelength of approximately 1030 nm. The portion 3b of the pump radiation 3 that is transmitted by the volume bragg grating 5 and passes through the volume of the laser crystal 12 along an interaction length D is used for pumping. Since the length D that is traveled by the pump radiation 3 cannot be made to be of any size, due to thermal effects, only a portion of the pump radiation 3 is absorbed by the laser medium 12. In order to be able to use the non-absorbed radiation portion for pumping and to increase the efficiency of the pump operation, a retro-reflector in the form of an end mirror 14 is fitted in the pump radiation arrangement 11. The retro-reflector reflects the pump radiation 3c that is not absorbed by the laser medium 12 back into itself. The end mirror 14 reflects the pump radiation 3c back to the laser-active medium 12 so that it is again traversed by the pump radiation 3b and again travels the interaction length D. An additional portion of the pump radiation 3 is absorbed by the laser medium 12. The pump radiation arrangement 11 shown in FIGS. 3a, b is a simplified example and, where applicable, multiple additional mirrors may be provided in the pump radiation arrangement 11 in order to produce more than only two pump passes through the laser medium 12. A laser-active crystal including a material other than Yb:YAG can also be used as the laser-active medium 12. The laser-active medium may also have a geometry different from the rod-like geometry which is shown in FIGS. 3a, b, for example, the laser-active medium 12 may take up the shape of a disc or a plate.

The pump radiation 3c reflected back from the end mirror 14 to the volume bragg grating 5 is transmitted thereby and is introduced into the pump radiation source 1 together with the portion 3a of the pump radiation 3 reflected back at the volume bragg grating 5. The radiation portion 3c that is not absorbed by the laser-active medium 12 and that is reflected back into the pump radiation source 1 has not only spectral portions at the target wavelength $\lambda_z$ but also spectral portions 10 that are in the peripheral region of the excitable amplification spectrum of the pump radiation source 1. The non-absorbed spectral portion of the back-reflected pump radiation 3c typically has in this instance a power that is greater than that in the region of the target wavelength $\lambda_z$ because the power portion in this wavelength range has been substantially absorbed by the laser-active medium. Therefore, that undesirable spectral portion 10 particularly occurs at high pump power levels in a destabilization of the wavelength of the pump radiation source 1, which results in an increase of the wavelength spectrum emitted by the pump radiation source 1.

In order to protect the pump radiation source 1 from the undesirable spectral portions that are reflected back thereto, there is arranged in the pump radiation arrangement 11 of FIGS. 3a, b, a wavelength-selective element in the form of a plate-like etalon 15. The plate-like etalon 15 has a thickness d of approximately from 40 to 50 micrometers and is provided with a reflective coating B at the two parallel side faces. The etalon 15 is tilted through an angle α with respect to the beam direction 13 of the pump radiation 3.

Figure 3C:
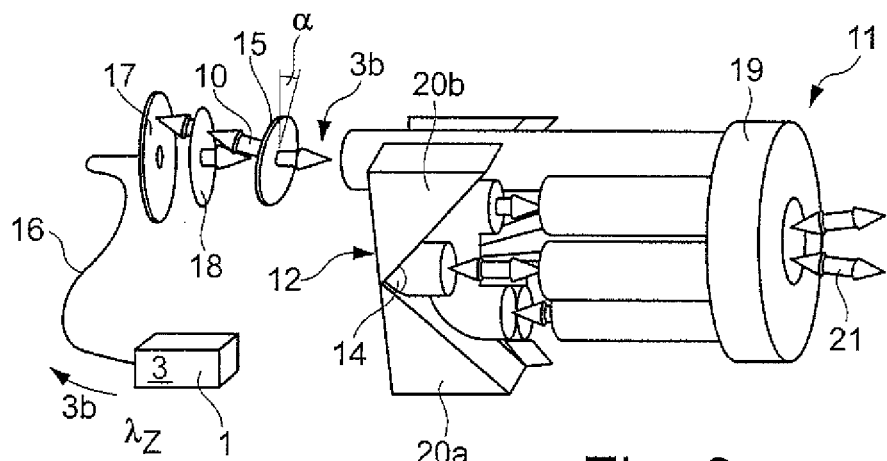
FIG. 3c is a schematic illustration of a disc laser pump radiation arrangement having a thin-layer etalon as a wavelength-selective element.

FIG. 3c shows another example embodiment of a pump radiation arrangement 11 for pumping a thin laser disc 12 (hidden in FIG. 3c). The pump radiation 3 of a pump radiation source 1 in the form of a pump diode which has a volume bragg grating which is integrated in the pump radiation source 1 (not shown in FIG. 3c) and which is stabilized at, for example, 969 nm for a Yb:YAG laser disc 12 or, for example, 976 nm for a Yb:Lu2O3 laser disc 12, is homogenized by a transport fiber 16 and supplied to a collimation lens 18 through a perforated disc 17. The collimation lens 18 collimates the pump radiation 3b that is transmitted by the wavelength-selective element 15. The element 15 is in the form of a thin-film etalon in the present example, as in FIGS. 3a, b. Undesirable spectral components 10 are reflected and redirected to a cooled heat sink (not shown) by the perforated disc 17 which is provided with a reflective coating.

The pump radiation 3b that is transmitted by the etalon 15 is introduced into a portion of the pump radiation arrangement 11, as known from WO2001/057970 A1, and which is not, therefore, described in detail in this instance. The pump radiation 3b is repeatedly redirected in many passes via a parabolic mirror 19 and via multiple redirection prisms 20a, 20b to the laser disc 12 which is reflective at the rear side and which is arranged at the focal point of the parabolic mirror 19. The pump radiation 3b is partially absorbed by the laser-active medium 12 that is present at that location before it is reflected at a retro-reflector 14. The retro-reflector 14 is constructed in the present example as a reflective retro-prism pair 20a, 20b that is impinged upon at the roof edge. The pump radiation 3b reaches the pump diode 1 over a substantially identical geometric path back through the laser disc 12 and finally back through the etalon 15 and the transport fiber 16.

While the pump radiation of a free-wheeling diode, that is to say, without back-reflection, is completely stabilized at the absorption wavelength of the laser disc 12 by the volume bragg grating (not shown), the diode spectrum can expand in a wavelength-stabilized pump diode without an additional wavelength-selective element, for example, in the form of the etalon 15 which is shown in FIG. 3c, in the pump radiation arrangement 11 in such a manner that it no longer corresponds to the absorption line of the laser disc 12. The absorption and therefore the efficiency of the disc laser or the power of the laser radiation 21 emitted thereby decreases drastically. For a complete passage of the pump radiation 3 through the pump radiation arrangement 11 (outward and return path), for example, 65% of the central spectral peak of the pump radiation 3 is absorbed but only approximately 20% of the peripheral regions. That is to say, approximately 80% is reflected back to the pump radiation source 1.

Although the proportion of the absorbed undesirable spectral portions would increase more powerfully than the portion at the absorption line when a thicker laser disc is used, when the number of recirculations is increased, or when the inversion of the laser disc is reduced, it is advantageous to use a thinner laser disc, a limited number of pump light passes, or a higher inversion. The thinner disc, the limited number of passes, or the higher inversion may provide good beam quality, reduce the complexity, and/or prevent non-linear effects. In the case of diodes as the pump radiation source 1 that are stabilized using a volume bragg grating 5, the volume bragg grating 5 is typically configured in such a manner that it reflects, for example, only approximately 20% of the peripheral regions of the pump spectrum. The remainder of the undesirable spectral portions is transmitted back to the diode and results in a destabilization, and therefore a reduction in the pump efficiency. The number values mentioned here are only of exemplary character and do not limit the scope of validity of the invention.

Figure 4:
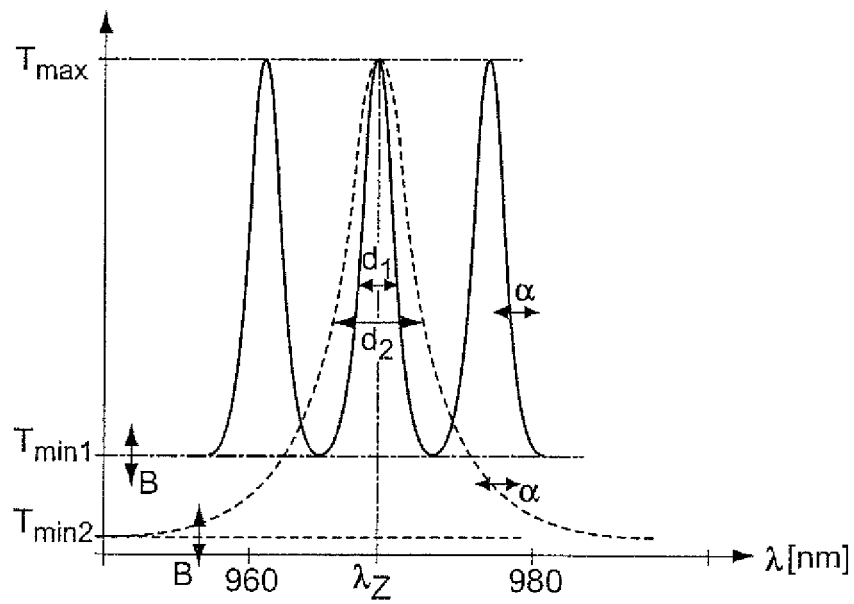
FIG. 4 is a schematic illustration of the wavelength-dependent transmission of two different etalons according to FIGS. 3a-c.

The angle of incidence of the pump radiation 3b on the etalon 15 or the etalon 15 itself can be adjusted precisely to the desired transmission characteristic by a suitable device (not shown). The effect of the etalon 15 on the pump radiation 3 is explained below with reference to FIG. 4. FIG. 4 is a schematic view of the wavelength-dependent transmission T of the etalon 15 in two different configurations. The transmission T of the etalon 15 varies in a manner dependent on the wavelength between a maximum transmission $T_{Max}$ and a minimum transmission $T_{Min1}$ or $T_{Min2}$. The difference between the maximum transmission $T_{Max}$ and the minimum transmission $T_{Min1}$, $T_{Min2}$, also referred to as contrast, can be adjusted using the coating B. More specifically, the contrast can be adjusted by selecting the reflectivity of the coating B. The minimum value $T_{Min1}$, $T_{Min2}$ can be, for example, 50% of the maximum transmission $T_{Max}$.

The (half-value) width $d_1$, $d_2$ of a peak of the transmission distribution T can be adjusted using the thickness d of the etalon 15. The wavelength at which the transmission of the etalon 15 is at a maximum can be adjusted using the tilting angle α and is typically selected so that this wavelength corresponds to the target wavelength $\lambda_z$. Production tolerances of the etalon 15 which slightly move the resonance wavelength with a perpendicular incidence can be compensated by varying the tilting angle α. The tilting angle α required for this is typically small and is between approximately 2° and a maximum of approximately 20°.

The undesirable spectral background of the pump radiation 3b that is reflected by the etalon 15 may be geometrically redirected, where applicable after reflection at other optical units, to a beam sump so that excessively reflected pump radiation 3 does not result in damage during the fine adjustment of the tilting angle α. Thus, for example, as shown in FIG. 3c, a highly reflectively coated perforated disc 17, through the opening of which a pump radiation fiber 16 is directed, can prevent back-reflections from reaching bonding locations of the fiber connector and the perforated disc 17 can ensure that such reflections are redirected and absorbed in the well-cooled connector receiving member.

The important aspect is that undesirable spectral portions 10 are weakened on their path through the etalon 15, the optical pump unit (for example, 19, 20a, 20b in FIG. 3c) and via the retro-reflector 14 back to the pump radiation source 1 to such an extent that those losses are predominant in the balance with respect to the amplification spectrum of the pump radiation source 1 so that a parasitic oscillation outside the absorption line of the active medium 12 is not produced.

Figure 5:
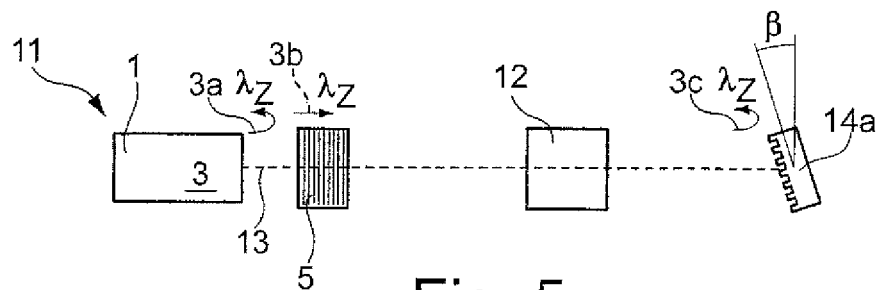
FIG. 5 is an illustration of an embodiment of the pump radiation arrangement having a grating waveguide mirror as a wavelength-selective element at an angle of incidence different from 0°.

Alternatively or additionally, a reflective element, for example, in the form of a grating waveguide mirror 14a, which acts as an end mirror of the pump radiation arrangement 11 as shown in FIG. 5, may also be used for filtering undesirable spectral portions 10. The grating waveguide mirror 14a reflects only pump radiation 3 in a narrow spectral range around the target wavelength $\lambda_z$ and allows the filtering of undesirable spectral portions 10 of the pump radiation 3. The grating waveguide mirror 14a can, for example, be constructed as in the article which is cited in the introduction and which is incorporated in the content of this application by reference with regard to this aspect.

Both the grating parameters and the width of the waveguide, that is to say, the spacing between the beam inlet face at which the grating is formed and the substrate can be adapted to each other in a suitable manner in order to obtain a constructive interference for pump radiation 3 at the target wavelength $\lambda_z$. The grating waveguide mirror 14a may have a higher angle acceptance and a comparatively broad-band reflection with a higher level of reflectivity with respect to typical volume bragg gratings so that fine adjustment can be dispensed with, where applicable. In FIG. 5, the grating waveguide mirror 14a is used as a retro-reflector with non-perpendicular incidence, i.e., at an angle β relative to the beam direction 13, in a Littrow arrangement. In the Littrow arrangement, the angle of incidence and the angle of reflection of the grating waveguide mirror 14a correspond to each other so that the pump radiation 3b, 3c is reflected back into itself. It will be understood that the grating waveguide mirror 14a can also be used with perpendicular incidence (β=0°) or at a tilting angle which differs from the Littrow angle.

Figure 6:
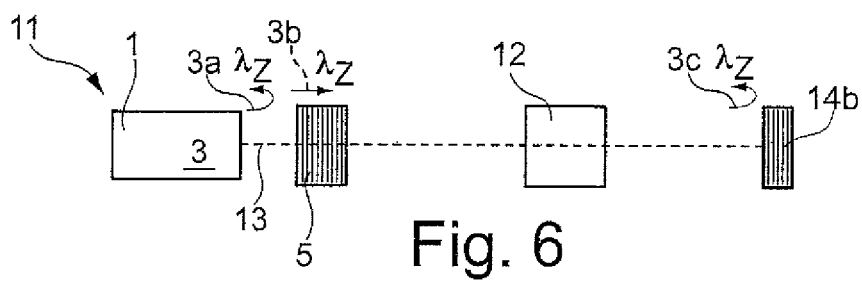
FIG. 6 is an illustration of an embodiment of the pump radiation arrangement having a wavelength-selective element in the form of a volume bragg grating and FIGS. 7a-7c are illustrations of embodiments of a pump radiation arrangement for pumping a laser medium in the form of a laser-active fiber.

In place of a grating waveguide mirror 14a, a volume bragg grating 14b may also be used as an end mirror or as a retro-reflector, as illustrated in FIG. 6. The volume bragg grating 14b is configured to reflect the impinging pump radiation 3 only in the desired wavelength range around the target wavelength λz (no pump radiation being transmitted). It is also possible to prevent undesirable spectral portions from being reflected back to the pump radiation source 1. In order to ensure that such a volume bragg grating 14b is suitable without any fine angular adjustment to the wavelength $\lambda_z$ of the pump radiation source 1 which is stabilized by the reflector 5, it may be necessary to use a period-modulated volume bragg grating (chirped VBG) 14b in order to obtain sufficient broadband capacity, the reflectance of such a volume bragg grating 14b being limited by the small refractive index difference thereof. Even if it is assumed that the reflectance of the volume bragg grating 14b is very substantially less than 100%, for example, at from 80 to 90%, this proportion of the pump radiation 3 which is not yet absorbed on the outward path through the pump radiation arrangement 11 would be usable on the return path.

Although in the two examples above the end mirror 14 was constructed as a wavelength-selective element, a wavelength-selection may optionally also be performed at other mirrors of the pump radiation arrangement 11. For example, wavelength selection may be performed at mirrors which are used to fold the beam path or to produce multiple passes through the laser-active medium 12. Thus, as a result of a combination of multiple spectrally sharp-edged coatings (e.g., interference filters) on different mirrors, the suppression of undesirable spectral components can be carried out if one portion reflects only longer-wave spectral ranges in addition to the desired pump wavelength $\lambda_z$, while the other portion reflects only shorter-wave spectral ranges in addition to the desired pump wavelength $\lambda_z$. In addition to volume bragg gratings and grating waveguide mirrors, it is also possible to use other types of reflecting wavelength-selective elements which may advantageously have a grating structure.

Additional implementations of a pump radiation arrangement 11 that are used to pump a laser-active medium in the form of a signal fiber 22 with a laser-active fiber portion 26, i.e., with doped (for example, erbium-doped) core, are described in greater detail below with reference to FIGS. 7a-c. In the pump radiation arrangement 11 shown therein, the pump radiation 3 which emerges from the pump radiation source 1 is coupled into a first pump fiber portion 23a, at which a reflector in the form of a fiber bragg grating 5 is inscribed in the region of an input-side fiber end for wavelength stabilization. The first pump fiber portion 23a is coupled to the signal fiber 22 with a laser-active fiber portion 26, for example, via a wavelength multiplexer (WDM element), via a lateral coupling, or via a pump fiber portion that extends parallel with the signal fiber 22 with a laser-active fiber portion 26. This forms an interaction region with a length D, at which the pump radiation 3 is coupled into the signal fiber 22, as indicated in FIG. 7a.

A first and a second additional fiber bragg grating 24a,b are inscribed in the signal fiber 22, more specifically in the core thereof, and act as end mirrors of a resonator which is formed at the laser-active fiber 22. The second fiber bragg grating 24b preferably constitutes an output coupler at which the laser radiation produced in the laser-active fiber portion 26 is coupled out. The radiation power at the second additional fiber bragg grating 24b is in this instance greater than at the first additional fiber bragg grating 24a. That is to say, the pump radiation direction 3b is in the present example directed counter to the radiation direction of the laser radiation produced in the laser-active fiber portion 26. In the case of a fiber amplifier arrangement, the additional fiber bragg gratings 24a, 24b may be dispensed with.

Figure 7A:
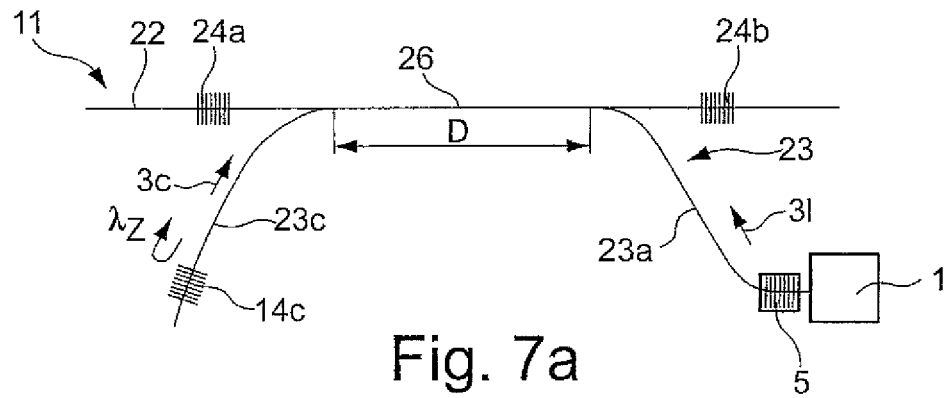

In the example shown in FIG. 7a, the pump fiber 23 has an additional pump fiber portion 23c, at which the pump radiation which is not absorbed by the laser-active fiber 22 is directed away therefrom. At the end of the additional pump fiber portion 23c, an additional fiber bragg grating 14c, which acts as an end mirror or as a retro-reflector, is inscribed in the pump fiber 23 in order to direct the pump radiation 3c back to the laser-active fiber portion 26 so that an additional radiation portion is coupled into the signal fiber 22 with a laser-active fiber portion 26. Undesirable spectral portions are suppressed by the fiber bragg grating 14c acting as a wavelength-selective element. Primarily pump radiation 3c at the target wavelength $\lambda_z$ is reflected back to the pump radiation source 1.

Figure 7B:
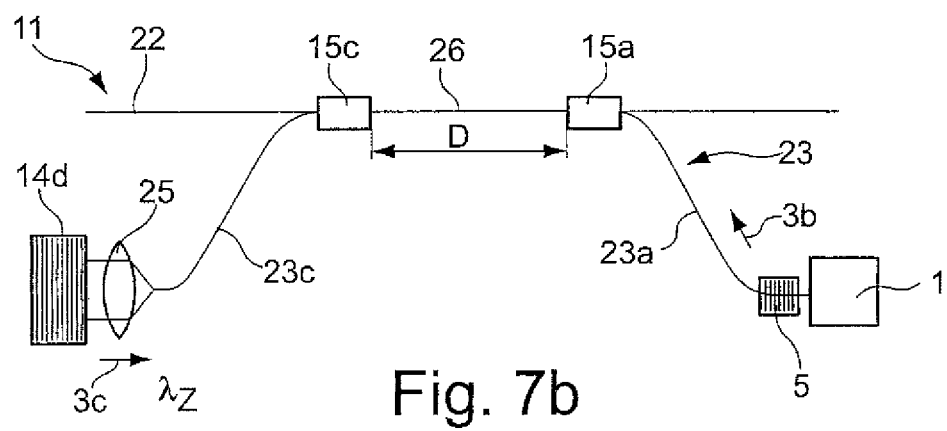

FIG. 7b shows a pump radiation arrangement 11 which differs from the one shown in FIG. 7a in that a volume bragg grating 14d acts as an end mirror and as a wavelength-selective element in place of the additional fiber bragg grating 14c. In order to direct the pump radiation from the additional pump fiber portion 23c with a free-beam propagation to the volume bragg grating 14d, an objective 25 collimates or focuses the pump radiation 3 that is discharged from the end of the additional pump fiber portion 23c before the radiation strikes the volume bragg grating 14d. Although the objective 25 in FIG. 7b is illustrated in a simplified manner as a lens, such an objective may include multiple optical elements that may also be constructed, for example, as reflective, optical elements. Where applicable, an additional objective may also be provided in order to couple the pump radiation 3 from the pump radiation source 1 into the first pump fiber portion 23a. Unlike what is shown in FIGS. 7a, b, it is also possible to provide a volume bragg grating as a reflector in place of a fiber bragg grating 5 in order to reflect back a portion of the pump radiation 3 to the pump radiation source 1. It is also possible to use a pump radiation source 1 in the form of a DFB or DBR laser with integrated grating structure for wavelength stabilization.

Figure 7C:
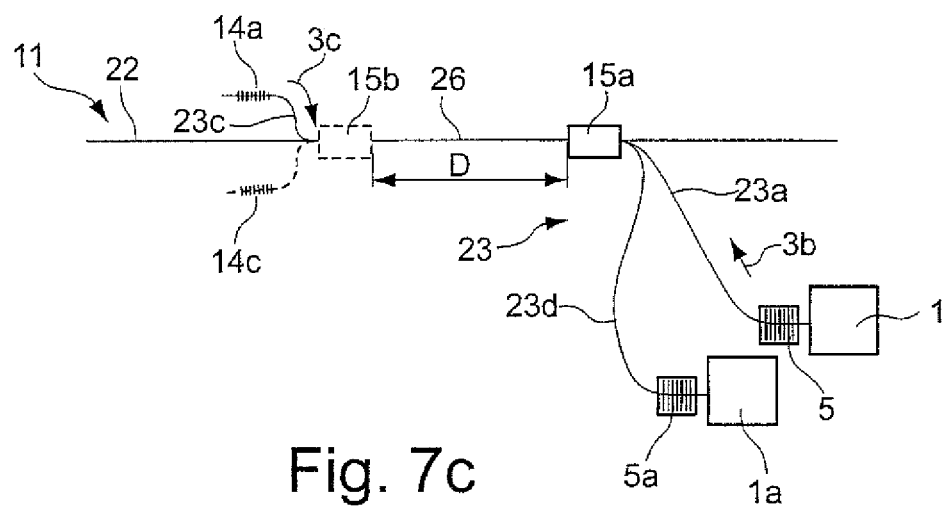

FIG. 7c shows another implementation of a pump radiation arrangement 11 in which a wavelength-selective element 15a is positioned between the first pump fiber portion 23a of the pump radiation source 1, which is stabilized by a wavelength-selective element 15, and the laser-active fiber portion 26. The pump radiation source 1 may be, for example, a wavelength-stabilized diode. However, it may, for example, also be a fiber laser itself. The wavelength-selective element 15a may be, for example, a wavelength multiplexer (WDM element) and at the same time couple the pump radiation 3b out of the pump fiber portion 23a into the signal fiber 22 or into the laser-active fiber portion 26, as illustrated in FIG. 7c; however, it is also possible to have a wavelength-selective element in the form of an etalon or a grating.

The pump radiation 3b can be coupled out by an additional wavelength multiplexer 15b out of the laser-active fiber portion 26 into a pump fiber portion 23c, which leads to a retro-reflector. A retro-reflector 14a, which may be in the form, for example, of a fiber bragg grating and which redirects the non-absorbed pump radiation 3c back into the laser-active fiber portion 26, can be coupled to such a wavelength multiplexer element 15b or a corresponding spliced pump fiber portion 23c (see FIG. 7c), but it is also possible to inscribe a fiber bragg grating directly into the signal fiber 22. The retro-reflector 14a also has in this instance wavelength-selective properties. In place of a fiber bragg grating 14a, however, a conventional retro-reflector may also be used such as, for example, one of the above-described components or a reflective fiber end. A wavelength-selective element may also be positioned at another location between the pump light source 1 and the retro-reflector 14a.

In place of an individual pump radiation source 1, it is also possible to use pump radiation sources which are stabilized at different wavelengths and which, for example, are superimposed using dense wave multiplexing (DWM) or dense wavelength division multiplexing (DWDM), as shown, for example, in WO2002071119, the disclosure of which is incorporated herein by reference in its entirety. DWDM typically results in a higher brilliance of the pump radiation used.

For example, as shown in FIG. 7c, there may be at least one additional pump radiation source 1a whose wavelength does not have to be identical to that of the first pump radiation source 1 but instead can be stabilized, for example, by another wavelength-selective element 15a (for example, in the form of a bragg grating) at a closely adjacent wavelength. In the case of dense wavelength multiplexing, the wavelength-selective element 15a for coupling pump radiation into the laser-active fiber portion 26 may be a DWDM element 15a in which the pump radiation is also coupled from another pump fiber portion 23d, which is optically coupled to the additional pump radiation source 1a.

The non-absorbed pump radiation can be distributed by another corresponding DWDM element 15b at the other end of the laser-active fiber portion 26 over multiple different wavelength ports, in which a retro-reflector 14a, c for the adjacent pump radiation wavelengths is provided, respectively, as indicated in FIG. 7c. The retro-reflector can be constructed, for example, as a fiber bragg grating 14a,c which is inscribed in a fiber portion which is spliced to the DWDM element 15b and which is associated with a respective port, and is adapted to the respective wavelength of the pump radiation.

Alternatively, a DWDM element 15b can be used with only one port which redirects the closely adjacent wavelengths into a common fiber portion 23c to which a retro-reflector 14a is optically coupled. In this case in which pump radiation at multiple wavelengths is coupled out via a common port of the DWDM element 15b, a single fiber bragg grating 14a, which is suitable for reflecting the different pump radiation wavelengths, may act as the retro-reflector.

A corresponding method is also possible in the pump radiation arrangement 11 shown in FIG. 7b. The pump radiation of multiple pump radiation sources can be coupled in the same direction into the laser-active fiber core 26 via a WDM element or a DWDM element 15a and the pump radiation of the pump radiation sources can be separated from the laser radiation using an additional WDM or DWDM element 15c.

In place of a unidirectional pumping action, as shown in FIG. 7c, pumping of the laser-active fiber portion 26 in opposing directions can also be carried out. To that end, at least two pump wavelengths can be coupled into the laser-active fiber portion 26 via two separate WDM elements 15a,c (see FIG. 7b) in opposing directions (and at opposite sides). In this example, at least one additional pump light source is optically coupled to the WDM element 15c, to which the additional pump fiber portion 23c is also connected for reflecting the pump radiation of the pump radiation source 1, which is coupled via the WDM element 15a at the other end of the laser-active fiber portion 26.

Alternatively to the lateral pumping of the laser-active fiber 22 or the laser-active fiber portion 26, as described above in conjunction with FIGS. 7a-c, optical pumping may also be carried out in which the pump radiation 3 is coupled at the front side into the signal fiber 22 and, where applicable, also coupled out or reflected again at the front side.

Pump radiation sources having a different structure are also possible. The above-described and other pump radiation sources can be used in rod, slab, disc or fiber lasers. Such use in high-power fiber lasers is particularly advantageous. Active fibers having a short length should be used for high peak power levels in order to suppress non-linear effects such as, for example, the Raman and Brillouin scattering. So that pump radiation can be absorbed efficiently and a high peak power of the laser radiation can be reached, the active core should be directly pumped. A pump radiation of high intensity and high brilliance is required for this, which can be achieved using a DWM diode arrangement. If pumping is carried out from two sides or a double pass of the pump radiation is achieved by the fiber with back-reflection, the pump diodes can be urged out of their stabilized wavelength, as described above, and the DWM no longer operates, which can be prevented by providing wavelength-selective elements.

A number of implementations have been described. Nevertheless, it will be understood that various modifications may be made without departing from the spirit and scope of the invention. Accordingly, other implementations are within the scope of the following claims.

What is claimed is:

1. A pump radiation arrangement comprising:
   a laser pump radiation source operable to produce laser pump radiation;
   a wavelength-dependent reflector operable to stabilize the wavelength of the pump radiation source, wherein the wavelength-dependent reflector comprises a grating structure;
   a laser-active medium through which the pump radiation passes in a bidirectional manner during use of the pump radiation arrangement;
   a retro-reflector arranged to reflect pump radiation that passes through the laser-active medium without being absorbed back to the pump radiation source; and
   a wavelength filter configured to filter a predetermined spectral portion of the pump radiation that passes through the laser-active medium without being absorbed, wherein the predetermined spectral portion of the pump radiation comprises spectral components that overlap an absorption spectrum of the laser-active medium and that are outside of a target wavelength band for exciting the laser-active medium.

2. The pump radiation arrangement according to claim 1, wherein the wavelength-dependent reflector is arranged to reflect back a portion of the produced pump radiation to the pump radiation source and to supply a transmitted portion of the pump radiation to the laser-active medium.

3. The pump radiation arrangement according to claim 1, wherein the wavelength filter is an interference filter.

4. The pump radiation arrangement according to claim 3, wherein the interference filter is an etalon that is orientated at an angle (a) relative to a beam direction of the pump radiation.

5. The pump radiation arrangement according to claim 4, wherein the etalon comprises a plane parallel plate having a reflective coating on a first side of the plate and on a second opposite side of the plate.

6. The pump radiation arrangement according to claim 1, further comprising a collection element configured to redirect the predetermined spectral portions redirected by the wavelength filter from the optical path of the pump radiation.

7. The pump radiation arrangement according to claim 1, wherein the laser-active medium is a solid-state crystal and the wavelength filter is arranged in the beam path of the pump radiation between the wavelength-dependent reflector and the solid-state crystal or between the solid-state crystal and the retro-reflector.

8. The pump radiation arrangement according to claim 1, wherein the retro-reflector is an additional wavelength-dependent reflector.

9. The pump radiation arrangement according to claim 8, wherein the retro-reflector comprises a grating structure.

10. The pump radiation arrangement according to claim 9, wherein the grating structure comprises a volume Bragg grating.

11. The pump radiation arrangement according to claim 9, wherein the retro-reflector comprises a grating waveguide mirror.

12. The pump radiation arrangement according to claim 1, wherein the laser-active medium comprises a laser-active fiber and the pump radiation arrangement further comprises a first pump fiber portion arranged to guide pump radiation to the laser-active fiber.

13. The pump radiation arrangement according to claim 12, further comprising a second pump fiber portion arranged to guide pump radiation that is not absorbed by the laser-active fiber to the retro-reflector.

14. The pump radiation arrangement according to claim 13, wherein the retro-reflector comprises a fiber Bragg grating that is formed in the second pump fiber portion.

15. The pump radiation arrangement according to claim 13, further comprising an objective arranged between an outlet-side end of the second pump fiber portion and the retro-reflector.

16. The pump radiation arrangement according to claim 12, further comprising an additional laser pump radiation source and a second pump fiber portion arranged to supply additional pump radiation to the laser-active fiber.

* * * * *